United States Patent [19]

Badami et al.

[11] Patent Number: 4,568,631

[45] Date of Patent: Feb. 4, 1986

[54] PROCESS FOR DELINEATING PHOTORESIST LINES AT PATTERN EDGES ONLY USING IMAGE REVERSAL COMPOSITION WITH DIAZOQUINONE

[75] Inventors: Dinesh A. Badami, Williston; Mark C. Hakey, Milton, both of Vt.; Holger Moritz, Holzgerlingen, Fed. Rep. of Germany

[73] Assignee: International Business Machines Corporation, Armonk, N.Y.

[21] Appl. No.: 605,088

[22] Filed: Apr. 30, 1984

[51] Int. Cl.⁴ .......................... G03F 7/26; G03C 5/00
[52] U.S. Cl. .................................. 430/315; 430/5; 430/191; 430/192; 430/311; 430/312; 430/314; 430/323; 430/324; 430/325; 430/328; 430/330
[58] Field of Search .................. 430/5, 191, 192, 311, 430/312, 314, 315, 325, 328, 330, 323, 324

[56] References Cited

U.S. PATENT DOCUMENTS

| | | | |
|---|---|---|---|
| 4,104,070 | 8/1978 | Moritz et al. | 430/194 |
| 4,115,120 | 9/1978 | Dyer et al. | 430/325 |
| 4,125,650 | 11/1978 | Chiu et al. | 430/191 |
| 4,212,935 | 6/1980 | Canavello et al. | 430/191 |
| 4,259,430 | 3/1981 | Kaplan et al. | 430/191 |
| 4,321,811 | 11/1982 | Somekh et al. | 148/1.5 |
| 4,374,911 | 2/1983 | Hartley | 430/5 |

OTHER PUBLICATIONS

Feder et al., *IBM Technical Disclosure Bulletin*, vol. 22, No. 5, 10/1979, p. 2133.
Moreau et al., *IBM Technical Disclosure Bulletin*, vol. 13, No. 5, 10/1970, p. 1303.
Pacansky, J. et al., *IBM J. Res. Develop.*, vol. 23, No. 1, 1/1979, pp. 42-51.
Hamel et al., "Image Reversal Lift-Off Process," IBM TDB, vol. 24, No. 10, Mar. 1982, p. 5063.
Moritz, "Linewidth Control with Image Reversal," IBM TDB, vol. 23, No. 7A, Dec. 1980, pp. 2725-2726.

*Primary Examiner*—Charles L. Bowers, Jr.
*Attorney, Agent, or Firm*—Barbara A. McDowell; Mark F. Chadurjian; Howard J. Walter

[57] ABSTRACT

An optical photolithographic process in which resist lines having widths in the micron and sub-micron range are produced without the use of a fine line photomask. A positive photoresist having an additive for image reversal is applied to the surface of a semiconductor substrate. The photoresist is exposed through a photomask to ultraviolet light. The edges of the opaque sections of the mask diffract the ultraviolet light, forming partially exposed areas between the exposed and unexposed areas formed in the photoresist. After development in a solvent to remove the exposed areas, the photoresist undergoes an image reversal process. The photoresist is first baked at 100° C. for 30 minutes. During this bake step, the photoactive decomposition products present in the partially exposed areas react, freezing the solubility of the partially exposed areas with respect to that of the unexposed areas. The photoresist is then blanket exposed and developed in a solvent, leaving the partially exposed areas on the substrate. The resulting thin resist lines can be used to form narrow isolation trenches by coating the substrate with a quartz film and lifting off the resist lines.

19 Claims, 4 Drawing Figures

PROCESS FOR DELINEATING PHOTORESIST LINES AT PATTERN EDGES ONLY USING IMAGE REVERSAL COMPOSITION WITH DIAZOQUINONE

DESCRIPTION

1. Technical Field

The present invention relates generally to the field of semiconductor device processing, and more specifically to optical photolithographic mask image processing.

2. Background Art

In recent years, optical photolithography has been used widely in the semiconductor manufacturing field. In optical photolithography, a semiconductor substrate is covered with a photoresistive polymer layer. A mask is placed above the photoresist layer, and ultraviolet light is projected onto the photoresist layer through the mask. If the photoresist is "positive" those portions of the photoresist not covered by the mask undergo a chemical reaction such that the exposed regions are more soluble in a developer solvent than the unexposed regions. Conversely, if the photoresist is "negative", the regions of the photoresist not covered by the mask undergo a "cross-linking" reaction, which increases the molecular weight of the exposed regions and makes them less soluble in a developer than the unexposed regions. In either case, the photoresist layer is then developed in a solvent. The solvent removes the less soluble regions of the photoresist (i.e., the exposed regions if the photoresist is positive and the unexposed regions if it is negative), leaving behind portions of the photoresist (i.e., "resist lines") which serve as a mask for subsequent semiconductor processing.

"Image reversal" is a specific photolithographic process in which positive photoresist patterns are "reversed" to form negative resist patterns. In image reversal, a positive photoresist (having a chemical additive for image reversal) is masked and exposed as explained above to produce exposed regions of lower solubility and unexposed regions of higher solubility. The photoresist layer is then baked and blanket exposed such that the initially unexposed layers are now more soluble than the initially exposed layers. Thus, upon subsequent development in a solvent, the positive photoresist acts as a negative photoresist. Examples of image reversal processing appear in U.S. Pat. Nos. 3,264,104 and 4,104,070; Hamel et al, "Image Reversal Lift-Off Process", *IBM TDB*, Vol. 24, No. 10, March 1982, p. 5063; and Hamel et al, "Negative-Acting Positive Photoresist", *IBM TDB*, Vol. 23, No. 5, October 1980, p. 1839.

In view of the trend in the art toward packing more transistors on less chip space, it has become necessary to produce resist lines having widths in the micron and sub-micron range. Difficulty has been encountered in using optical photolithographic processes to manufacture such thin lines. The usual procedure has been to mask the photoresist with a masking element having a series of narrow mask lines (i.e., lines having thicknesses in the micron and sub-micron range). Such a masking element is difficult to manufacture. Furthermore, even if one were to use such a mask in a conventional photolithographic process, it is possible that these narrow mask lines would not produce a sufficient exposure contrast to produce thin resist lines on the substrate. Thus, specialized projection tools have to be used in conjunction with these fine line masking elements in order to promote sufficient exposure contrast.

A need has evolved in the art for an optical photolithographic manufacturing process in which thin resist lines can be produced without the use of a fine line masking element or specialized projection tools. This process would be especially useful where the thin resist lines are reversed and used to form narrow trench isolation patterns. These narrow isolation trenches would not only save available chip space but would also alleviate trench refill, improving planarization and facilitating polyimide back-etch.

SUMMARY OF THE INVENTION

Thus, it is an object of the present invention to provide an improved optical photolithographic semiconductor manufacturing process.

It is another object of the invention to provide an improved optical photolithographic process which is capable of producing resist lines in the micron and sub-micron range without the use of specialized projection tools.

It is yet another object of the invention to provide an improved optical photolithographic process by which resist lines in the micron and sub-micron range can be produced without the use of a fine line masking element.

It is a further object of the invention to provide an improved optical photolithographic process which can be used to produce narrow trench isolation regions.

These and other objects of the invention are realized by a multiple step optical photolithographic process which provides photoresist line patterns having widths in the micron and sub-micron range. A semiconductor substrate is covered with a positive photoresist. The photoresist contains an additive for image reversal. A mask having a plurality of large opaque areas separated by large transparent areas is provided to the photoresist. When the photoresist is subsequently exposed through the mask, the edges of the opaque areas produce light diffraction patterns in the photoresist. Thus, the photoresist beneath the edges of the opaque areas is only partially exposed. The photoresist is developed in a solvent in order to remove portions of the photoresist corresponding substantially to the exposed regions of the photoresist. The remaining photoresist is then baked at about 100° C. for 30 minutes, causing a hardening reaction in the partially exposed regions of the photoresist. This reaction is triggered by the decomposition products produced during partial exposure. The major portion of the remaining photoresist (i.e., the unexposed regions) do not react during this baking step because they do not contain these decomposition products. The hardening reaction "freezes" the solubility of the partially exposed areas with respect to the solubility of the unexposed areas. The photoresist is then blanket exposed, increasing the solubility of the unexposed regions of the photoresist. Thus, upon subsequent treatment of the photoresist with a second developer, only those portions of the photoresist corresponding substantially to the unexposed regions of the photoresist are dissolved. The remaining photoresist is that portion which was only partially exposed by the mask edge diffraction effects and hardened by the post development bake step. Thus, by use of the optical photolithographic process of the invention, resist lines in the order of 0.5 to 2.0 microns in thickness can be formed without the use of a fine line masking element. Moreover, these resist lines can be reversed to produce narrow trench isolation regions.

BRIEF DESCRIPTION OF THE DRAWING

The foregoing and other features of the invention will become more apparent upon a detailed description of the best mode of carrying out the invention. In the description to follow, reference will be made to the accompanying drawing, in which.

BEST MODE FOR CARRYING OUT THE INVENTION

Figure 1A:
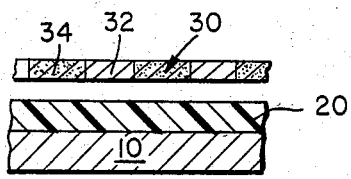
FIGS. 1A–1D are cross-sectional views of a semiconductor substrate undergoing the process steps of the invention.

As shown in FIG. 1A, a semiconductor substrate 10 is covered with a positive photoresist layer 20. The positive photoresist used (e.g., a diazoquinone photosensitive polymer such as AZ 1350J, commercially available through Shipley Co.) contains an additive (e.g., 1% imidazole) which produces image reversal. A photomask 30 is positioned above photoresist layer 20. Note that the photomask 30 and photoresist layer 20 could also abut one another. The photomask 30 includes transparent segments 32 and opaque segments 34. Photomask 30 is constructed such that the edges of the opaque portions 34 define the desired resist lines.

Figure 1B:
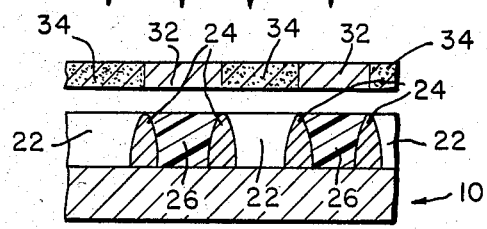

As shown in FIG. 1B, when the photoresist is imagewise exposed to light (e.g., ultraviolet light) from a light source through photomask 30, the light will produce a diffraction pattern defined by the pattern edges of the opaque segments 34 (or the intersection of the clear and opaque segments) of photomask 30. The portions of the photoresist which are exposed to the diffracted light are thus only "partially" exposed. That is, since the intensity of incident light decreases with increasing diffraction, the photoactive compounds within those portions of the photoresist receiving the diffracted light will only partially react. Thus, imagewise exposure through photomask 34 produces exposed areas 22, unexposed areas 26, and partially exposed areas 24 in the underlying photoresist layer 20.

Figure 1C:
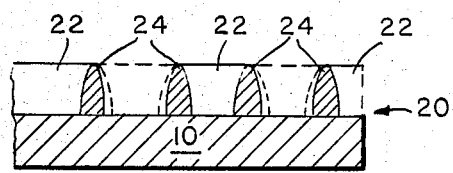
Figure 1D:
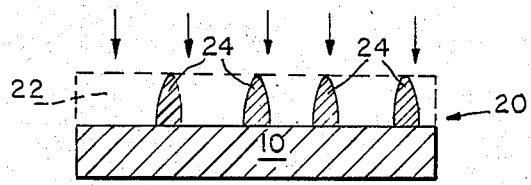

After light irradiation, photomask 30 is removed and photoresist layer 20 is developed in a dilute solvent. The composition of the solvent (as well as other system parameters such as develop time, solvent temperature, photoresist composition and the optical parameters of the light) is set such that all of the areas of the photoresist layer which were exposed to more than approximately 50% of the maximum light beam intensity are dissolved away. Thus, as shown in FIG. 1C, the exposed areas 26 of photoresist layer 20 are removed. Further, portions of the partially exposed areas 24 (i.e., those portions which were exposed to more than approximately 50% of the maximum intensity of the light beam) are also removed by the solvent. However, since the intensity of the light beam falls rapidly as a function of angular diffraction, the portion of the photoresist layer 20 removed by the solvent corresponds substantially to exposed areas 26. This is shown by the dashed lines of FIG. 1C. Both the shape and the amount of partially exposed area removed (as well as the original shape of the partially exposed areas) can be controlled by varying the above-mentioned system parameters.

The remaining portions of the partially exposed areas 24 as well as the unexposed areas 22 of photoresist 20 and then treated for image reversal. The photoresist 20 is first baked for approximately 30 minutes at approximately 100° C. During baking, a reaction occurs in the partially exposed areas 24 which "hardens" them with respect to unexposed areas 24. By "hardening" the partially exposed areas 24, this bake step freezes (or slightly decreases) the solubility of these areas, such that during a subsequent exposure step their solubility will not increase (as will the solubility of the unhardened unexposed areas 22). The reaction is triggered by the decomposition products (carboxylate salts) of the photoactive compounds which reacted during partial exposure. The unexposed areas 22 do not have these photoactive compound decomposition products, and thus do not undergo this hardening reaction. The mechanism of this reaction is a decarboxylation process, which is described in the above-mentioned March 1982 Hamel *IBM TDB* article.

After baking, photoresist layer 20 is blanket exposed. Since the exposed areas 22 did not undergo the hardening reaction, their solubility will be greater than that of the partially exposed areas 22. Thus, the treating of the photoresist by baking and blanket exposing produces different solubility characteristics. When the assembly is subsequently developed in a solvent, unexposed areas 22 will be dissolved, leaving partially exposed areas 24 on the surface of semiconductor substrate 10.

As described above, the optical photolithography process of the invention utilizes a standard photomask to produce resist lines in the micron and sub-micron range. Specifically, the manufacturing process of the invention has been used in conjunction with AZ 1350J photoresist having a 1% imidazole additive to produce resist lines ranging from 0.55 to 1.2 microns in width.

A specific application of this technique would be to provide trench isolation patterns which are formed by using a dielectric lift-off process to provide a photoresist-to-etch-mask-reversal in order to convert the narrow lines into narrow trenches. For example, a quartz film of 80–100 Angstroms in thickness is sputtered onto the surface of the semiconductor substrate, covering the resist lines. The resist lines are then removed by lift-off processing in a heated developer such as J-100, commercially available through the Shipley Co. The remaining thin quartz defines narrow trenches into which an oxide can be grown or sputtered to form narrow isolation regions. Thus, the thin resist lines produced via the process of the inventin could be used as a mask for any subsequent manufacturing process in which features having thicknesses in the micron or sub-micron range are to be produced.

By use of the manufacturing method of the invention, the profile of the resist lines can be easily manipulated by setting the optical parameters of the light (e.g., F-stop, focus, partial coherence and spectral distribution). Other ways in which the profile of the resist lines may be controlled are changing the composition of the photoresist and controlling its develop time. These parametric controls provide flexibility to the optical photolithographic process of the invention. This flexibility is needed, for example, when adjacent resist lines are to be joined to form continuous isolation structures.

It is to be understood that modifications can be made to the structures and teachings of the best mode as described above without departing from the spirit and scope of the invention.

We claim:

1. A method of photolithographic mask image processing, comprising the steps of:

applying a photoresist layer onto a surface of a substrate, said photoresist layer comprising a photosensitive diazoquinone and an additive which produces image reversal;

positioning a photomask above said photoresist layer, said photomask including a plurality of first segments separated by a plurality of second segments;

optically exposing said photoresist layer with actinic radiation through said plurality of first segments of said photomask to form exposed areas, partially exposed areas, and unexposed areas in said photoresist layer;

developing said photoresist layer to remove said exposed areas and portions of said partially exposed areas;

baking said photoresist layer at an elevated temperature to harden said partially exposed areas with respect to said unexposed areas;

blanket exposing said photoresist layer with actinic radiation to cause said unexposed areas to have a higher solubility than said partially exposed areas; and developing said photoresist layer for a time sufficient to remove portions of said photoresist layer corresponding substantially to said unexposed areas, whereby the remaining portions of said partially exposed areas form thin resist lines on the semiconductor substrate.

2. The method as recited in claim 1, wherein each of said remaining portions of said partially exposed areas of said photoresist are approximately 0.55 to 1.2 microns in width.

3. The method as recited in claim 1, wherein said photoresist layer comprises a diazoquinone photosensitive polymer having a 1% imidazole additive for image reversal.

4. A method of photolithographic mask image processing, as recited in claim 1, additionally comprising the steps of:

applying a film onto the semiconductor substrate, said film covering said mask;

lifting off said mask to form a plurality of grooves in said film;

etching the semiconductor substrate through said plurality of grooves to form a plurality of narrow trenches in the semiconductor substrate; and forming isolation regions within said plurality of narrow trenches of said semiconductor substrate.

5. The method as recited in claim 4, wherein said step of image reversing said photoresist layer comprises the steps of:

baking said photoresist layer, said partially exposed areas having decomposition products which react to cause said partially exposed areas to harden with respect to said unexposed areas; and blanket exposing said photoresist layer.

6. A method of photolithographic mask image processing, comprising the steps of:

applying a photoresist layer onto a surface of a semiconductor substrate, said photoresist layer comprising a photosensitive diazoquinone and an additive which produces image reversal;

positioning a photomask of transparent segments and opaque segments above said photoresist layer;

optically exposing said photoresist layer with actinic radiation through said photomask to form exposed areas, partially exposed areas and unexposed areas in said photoresist layer, said partially exposed areas being located between said exposed areas and said unexposed areas of said photoresist layer;

developing said photoresist layer in a solvent to remove said exposed areas and portions of said partially exposed areas of said photoresist layer;

image reversing said photoresist layer; and developing said photoresist layer to remove a portion of said photoresist layer corresponding substantially to said unexposed areas, the remaining partially exposed areas of said photoresist layer forming a mask.

7. A method of photolithographic mask image processing, comprising the steps of:

applying a layer of positive photoresist to a surface of a substrate, said photoresist layer comprising a photosensitive diazoquinone and an additive which produces image reversal;

image-wise exposing said photoresist layer through a photomask including clear and opaque segments with actinic radiation from a light source, to produce exposed areas in said photoresist layer corresponding to said clear segments of said mask, unexposed areas in said photoresist layer corresponding to said opaque segments of said mask, and partially exposed areas in said photoresist between said exposed areas and said unexposed areas, said partially exposed areas being formed by diffraction of said actinic radiation at intersections of said clear and opaque segments of said photomask;

removing portions of said photoresist layer corresponding substantially to said exposed areas by developing said photoresist layer in a first solvent;

treating said photoresist layer to cause said partially exposed areas to become less soluble than said unexposed areas; and removing portions of said photoresist layer corresponding substantially to said unexposed areas by developing said photoresist layer in a second solvent, the remaining portions of said partially exposed areas of said photoresist layer forming a mask.

8. A method of photolithographic mask image processing, comprising the steps of:

applying a layer of positive photoresist onto a surface of a semiconductor substrate, said photoresist layer comprising a photosensitive diazoquinone and an additive which produces image reversal;

positioning a photomask above said photoresist layer, said mask comprising a plurality of opaque segments separated by a plurality of transparent segments, said opaque segments having pattern edges;

image-wise exposing said photoresist layer through said plurality of transparent segments of said photomask with actinic radiation from a light source to form exposed areas, unexposed areas, and partially exposed areas in said photoresist layer, said exposed areas of said photoresist layer being formed beneath said plurality of transparent segments of said mask, said unexposed areas of said photoresist layer being formed beneath said plurality of opaque segments of said mask, and said partially exposed areas of said photoresist layer being formed between said exposed areas and said unexposed areas of said photoresist layer, said partially exposed areas being formed by diffraction of said actinic radiation, said diffraction being produced by said pattern edges of said opaque segments;

developing said photoresist layer to remove said exposed areas and portions of said partially exposed areas;

baking said photoresist layer at an elevated temperature to harden said partially exposed areas with respect to said unexposed areas;

blanket exposing said photoresist layer to increase the solubility of said unexposed areas with respect to the solubility of said partially exposed areas; and developing said photoresist layer in a second solvent to remove portions of said photoresist layer corresponding substantially to said unexposed areas of said photoresist layer, the remaining portions of said partially exposed areas of said photoresist layer forming thin resist lines on said semiconductor substrate.

9. A method of photolithographic mask image processing, comprising the steps of:

applying a layer of a photosensitive polymer to a surface of a semiconductor substrate, said photosensitive polymer comprising a photosensitive diazoquinone and an additive which produces image reversal;

providing a photomask above said photosensitive layer, said photomask comprising clear and opaque segments, each of said opaque segments having pattern edges;

image-wise exposing said photosensitive layer through said photomask with actinic radiation from a light source, said light producing exposed areas in portions of said photosensitive layer beneath said transparent segments of said photomask and unexposed areas in portions of said photosensitive layer beneath said opaque segments of said photomask, said pattern edges of said opaque segments causing light diffraction to form partially exposed areas between said exposed areas and said unexposed areas of said photosensitive layer;

developing said photosensitive layer in a solvent, said solvent dissolving regions of said photosensitive layer exposed to more than approximately 50% of the maximum intensity of said light, said solvent thus dissolving said exposed areas and portions of said partially exposed areas;

baking said photoresist layer at an elevated temperature to freeze the solubility of said partially exposed areas;

blanket exposing said photosensitive layer to increase the solubility of said unexposed areas so that they are more soluble than said partially exposed areas; and developing said photosensitive layer in a solvent, said solvent dissolving portions of said photoresist layer corresponding substantially to said unexposed areas, the remaining portions of said partially exposed areas thus defining thin resist lines on the semiconductor substrate.

10. A method of photolithographic mask image processing, as recited in claim 9, additionally comprising the steps of:

applying a film onto the substrate, said film covering said mask; and lifting off said mask to form a plurality of grooves in said film.

11. A method of photolithographic mask image processing, as recited in claim 10, additionally comprising the step of:

forming isolation regions within said plurality of narrow trenches of said semiconductor substrate.

12. The method of claim 11, wherein said resist lines are on the order of 0.5 to 2.0 microns in thickness.

13. The method of claim 11, wherein said film comprises a layer of quartz of 80–100 Angstrom in thickness.

14. The method of claim 13, wherein said layer of quartz is sputtered onto the surface of the substrate.

15. The method of claim 9, wherein said partially exposed areas of said photosensitive layer comprise photoactive compounds which partially react to form decomposition products during said imagewise exposing step, and wherein said decomposition products react to substantially freeze the solubility of said partially exposed areas during said baking step.

16. The method of claim 15, wherein said decomposition products are carboxylate salts and where the reaction of said decomposition products during said baking step comprises a decarboxylation process.

17. The method of claim 9, wherein the shape of the thin resist lines can be controlled by varying the temperature of the solvent, the composition of the photoresist layer and the optical parameters of the light.

18. A method of photolithographic mask image processing, comprising the steps of:

applying a photoresist layer onto the surface of a substrate, said photoresist layer comprising a photosensitive diazoquinone and an additive which produces image reversal;

positioning a photomask above said photoresist layer, said photomask including a plurality of first segments separated by a plurality of second segments;

optically exposing said photoresist layer with actinic radiation through said plurality of first segments of said photomask to form exposed areas, partially exposed areas, and unexposed areas in said photoresist layer;

developing said photoresist layer to remove said exposed areas and portions of said partially exposed areas;

image reversing said photoresist layer; and developing said photoresist layer for a time sufficient to remove portions of said photoresist layer corresponding substantially to said unexposed areas.

19. A method of photolithographic mask image processing, as recited in claim 18, wherein said step of image reversing comprises:

treating said photoresist layer to cause said partially exposed areas to become less soluble than said unexposed areas.

* * * * *